US008100734B2

(12) United States Patent
Hack et al.

(10) Patent No.: US 8,100,734 B2
(45) Date of Patent: *Jan. 24, 2012

(54) ORGANIC LIGHT EMITTING DEVICES FOR ILLUMINATION

(75) Inventors: Michael Hack, Lambertville, NJ (US); Min-Hao Michael Lu, Lawrenceville, NJ (US); Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 456 days.

This patent is subject to a terminal disclaimer.

(21) Appl. No.: 11/580,590

(22) Filed: Oct. 12, 2006

(65) Prior Publication Data

US 2007/0029906 A1 Feb. 8, 2007

Related U.S. Application Data

(63) Continuation of application No. 10/219,759, filed on Aug. 16, 2002, now Pat. No. 7,663,300.

(51) Int. Cl.
*H05B 33/10* (2006.01)
(52) U.S. Cl. ............... 445/24; 313/498; 313/506
(58) Field of Classification Search .............. 313/498, 313/504; 445/24
See application file for complete search history.

(56) References Cited

U.S. PATENT DOCUMENTS

| 5,294,870 | A | 3/1994 | Tang |
| 5,356,673 | A * | 10/1994 | Schmitt et al. ............... 427/446 |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 5,851,063 | A | 12/1998 | Doughty et al. |
| 6,097,147 | A | 8/2000 | Baldo et al. |
| 6,164,792 | A | 12/2000 | Nakagome |
| 6,165,554 | A * | 12/2000 | Halpern et al. ............ 427/248.1 |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,351,069 | B1 | 2/2002 | Lowery |

(Continued)

FOREIGN PATENT DOCUMENTS

EP    1 032 045    8/2000

(Continued)

OTHER PUBLICATIONS

G. Craford, *Overview of High Brightness LEDs and the Progress Towards High Power LED Illumination*, Intertech conference, San Diego, California, Oct. 17-19, 2001.

(Continued)

*Primary Examiner* — Nimeshkumar Patel
*Assistant Examiner* — Anthony Perry
(74) *Attorney, Agent, or Firm* — Kenyon & Kenyon LLP

(57) ABSTRACT

An organic light emitting device an a method of obtaining illumination from such a device is provided. The device has a plurality of regions, each region having an organic emissive layer adapted to emit a different spectrum of light. The regions in combination emit light suitable for illumination purposes. The area of each region may be selected such that the device is more efficient than an otherwise equivalent device having regions of equal size. The regions may have an aspect ratio of at least about four. All parts of any given region may be driven at the same current.

27 Claims, 6 Drawing Sheets

U.S. PATENT DOCUMENTS

| | | | |
|---|---|---|---|
| 6,384,529 B2 * | 5/2002 | Tang et al. | 313/506 |
| 6,407,408 B1 | 6/2002 | Zhou et al. | |
| 6,441,943 B1 | 8/2002 | Roberts | |
| 6,498,592 B1 | 12/2002 | Matthies | |
| 6,515,314 B1 | 2/2003 | Duggal et al. | |
| 6,521,915 B2 | 2/2003 | Odaki et al. | |
| 6,584,439 B1 | 6/2003 | Geilhufe et al. | |
| 6,628,067 B2 | 9/2003 | Kobayashi et al. | |
| 6,635,903 B2 | 10/2003 | Kato et al. | |
| 6,661,029 B1 | 12/2003 | Duggal | |
| 6,680,569 B2 | 1/2004 | Mueller-Mach | |
| 6,690,120 B2 | 2/2004 | Oskorep et al. | |
| 6,841,949 B2 | 1/2005 | Duggal | |
| 6,858,869 B2 | 2/2005 | Fujiwara | |
| 6,863,997 B2 | 3/2005 | Thompson et al. | |
| 6,869,695 B2 | 3/2005 | Thompson et al. | |
| 6,885,025 B2 | 4/2005 | Tung | |
| 2001/0022496 A1 | 9/2001 | Kobayashi et al. | |
| 2001/0028060 A1 | 10/2001 | Yamazaki | |
| 2002/0003594 A1 | 1/2002 | Ishii et al. | |
| 2003/0052616 A1 | 3/2003 | Antoniadis et al. | |
| 2003/0184218 A1 | 10/2003 | Brost et al. | |
| 2005/0006642 A1 | 1/2005 | Tung | |
| 2005/0017621 A1 | 1/2005 | Leo | |

FOREIGN PATENT DOCUMENTS

| | | |
|---|---|---|
| EP | 1 121 000 | 8/2001 |
| JP | 2000-36386 | 2/2000 |
| JP | 2000-43497 | 2/2000 |
| JP | 2001-223078 | 8/2001 |
| JP | 2001-265283 | 9/2001 |
| JP | 2001-290441 | 10/2001 |
| JP | 2001-313172 | 11/2001 |
| JP | 2002-62530 | 2/2002 |
| JP | 2002-164170 | 6/2002 |
| JP | 2002-184581 | 6/2002 |
| JP | 2003-288984 | 10/2003 |
| JP | 2003-330392 | 11/2003 |
| WO | WO 0139288 A1 * | 5/2001 |
| WO | 02/47310 | 6/2002 |
| WO | 03/026030 | 3/2003 |

OTHER PUBLICATIONS

Adachi et al., "Nearly 100% internal phosphorescence efficiency in an organic light emitting device", J. App. Phys. vol. 90 No. 10, 5048-51, Nov. 15, 2001.

U.S. Appl. No. 60/317,215, filed Sep. 4, 2001, entitled "Process And Apparatus For Organic Vapor Jet Deposition".

U.S. Appl. No. 10/219,760, filed Aug. 16, 2002, entitled "An Organic Photonic Integrated Circuit Using an Organic Photodetector an a Transparent Organic Light Emitting Device", to Forrest et al.

S. Tasch et al., "Efficient white light-emitting diodes realized with new processable blends of conjugated polymers", Appl. Phys. Lett. 71(20), Nov. 17, 1997, pp. 2883-2885.

J. Kido et al., "White light-emitting organic electroluminescent devices using the poly(N-vinylcarbazole) emitter layer doped with three fluorescent dyes", Appl. Phys. Lett. 64(7), Feb. 14, 1994, pp. 815-817.

B. D'Andrade et al., "Controlling Exciton Diffusion in Multilayer White Phosphorescent Organic Light Emitting Devices", Advanced Materials, Oct. 15, 2001.

P.E. Burrows, et al., *Appl. Phys. Lett.*, "Color-tunable Organic Light-Emitting Devices," Nov. 11, 1996, vol. 69, No. 20, pp. 2959-2961.

Zilan Shen, et al., *Science*, "Three-Color, Tunable, Organic Light-Emitting Devices," Jun. 27, 1997, vol. 276, pp. 2009-2011.

Kodak, "Kodak Digital Camara First To use Active-Matrix OLED Displays", Press Release, Mar. 3, 2003.

Junji Kido, et al., "Multilayer White Light-Emitting Organic Electrolumincescent Device," 267 Science 1332-1334 (1995).

IES Lighting Handbook Refereence vol. 1982, John E. Kaufma, PE, Fies, editor, Illuminating Engineering Society of North America, pp. 1-5, 1-13, 5-9 & 10, 5-26 & 27, 8-21 & 22.

Duggal, et al.— "Organic light-emitting devices for illumination quality white light", Applied Physics Letters, vol. 80, No. 19, pp. 3470-3472 (May 2002).

English translation of Office Action from Japanese Patent Application No. 2004-529550, mailed on Sep. 15, 2009.

English translation of Office Action from corresponding Japanese Patent Application No. 2004-529550, mailed on Apr. 6, 2010.

* cited by examiner

ORGANIC LIGHT EMITTING DEVICES FOR ILLUMINATION

RELATED APPLICATIONS

This application is a continuation of U.S. patent application Ser. No. 10/219,759, filed Aug. 16, 2002, which is incorporated herein by reference in its entirety.

GOVERNMENT RIGHTS

This invention was made with Government support under Contract No. DE-FG02-02ER83565 awarded by the Department of Energy. The government has certain rights in this invention.

RESEARCH AGREEMENT

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to the field of organic light emitting devices, and more particularly to illumination sources incorporating organic light emitting devices.

BACKGROUND OF THE INVENTION

Given that over 20% of the total U.S. electric energy production is consumed for lighting applications, significant savings can be made by the introduction of new, higher performance illumination sources. Such savings could be realized especially for any alternative light sources that provide improved energy efficiency as compared with the widely used, but very energy inefficient, incandescent light sources. For example, if the energy used for lighting in residential, commercial and industrial sectors could be reduced by as little as 5% in the U.S., over one billion dollars per year could be saved.

One alternate source of lighting is the inorganic Light Emitting Diodes (LEDs), as described in *Overview of High Brightness LEDs and the Progress Towards High Power LED Illumination*, Intertech conference, October 2001.

Attempts have been made to achieve white light sources with inorganic light emitting devices, as disclosed in U.S. Pat. No. 5,851,063 to Doughty et al.

Organic light emitting devices (OLEDs) are becoming increasingly desirable for a number of reasons. Many of the materials used to make such devices are relatively inexpensive, so organic light emitting devices have the potential for cost advantages over inorganic LEDs. In addition, the inherent properties of organic materials, such as their flexibility, may make them well suited for particular applications such as fabrication on a flexible substrate. In addition, the wavelength at which an organic emissive layer emits light may generally be readily tuned with appropriate dopants, while it may be more difficult to tune the inorganic emissive materials that are used in LEDs.

OLEDs make use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Representative OLED materials and configurations are described in U.S. Pat. Nos. 5,707,745, 5,703,436, 5,834,893, 5,844,363, 6,097,147, and 6,303,238, which are incorporated herein by reference in their entirety.

One or more transparent electrodes may be useful in an organic optoelectronic device. For example, OLED devices are generally intended to emit light through at least one of the electrodes. For OLEDs from which the light emission is only out of the bottom of the device, that is, only through the substrate side of the device, a transparent anode material, such as indium tin oxide (ITO), may be used as the bottom electrode. Since the top electrode of such a device does not need to be transparent, such a top electrode, which is typically a cathode, may be comprised of a thick and reflective metal layer having a high electrical conductivity. In contrast, for transparent or top-emitting OLEDs, a transparent cathode such as disclosed in U.S. Pat. Nos. 5,703,436 and 5,707,745 may be used. As distinct from a bottom-emitting OLED, a top-emitting OLED is one which may have an opaque and/or reflective substrate, such that light is produced only out of the top of the device and not through the substrate. In addition, a fully transparent OLED that may emit from both the top and the bottom.

As used herein, the term "organic material" includes polymers as wells as small molecule organic materials that may be used to fabricate organic optoelectronic devices. Polymers are organic materials that include a chain of repeating structural units. Small molecule organic materials may include substantially all other organic materials.

SUMMARY OF THE INVENTION

An organic light emitting device is provided. The device has a plurality of regions, each region having an organic emissive layer adapted to emit a different spectrum of light. The regions in combination emit light suitable for illumination purposes. The area of each region may be selected such that the device is more efficient than an otherwise equivalent device having regions of equal size. The regions may have an aspect ratio of at least about four. All parts of any given region may be driven at the same current.

DETAILED DESCRIPTION

Figure 1:
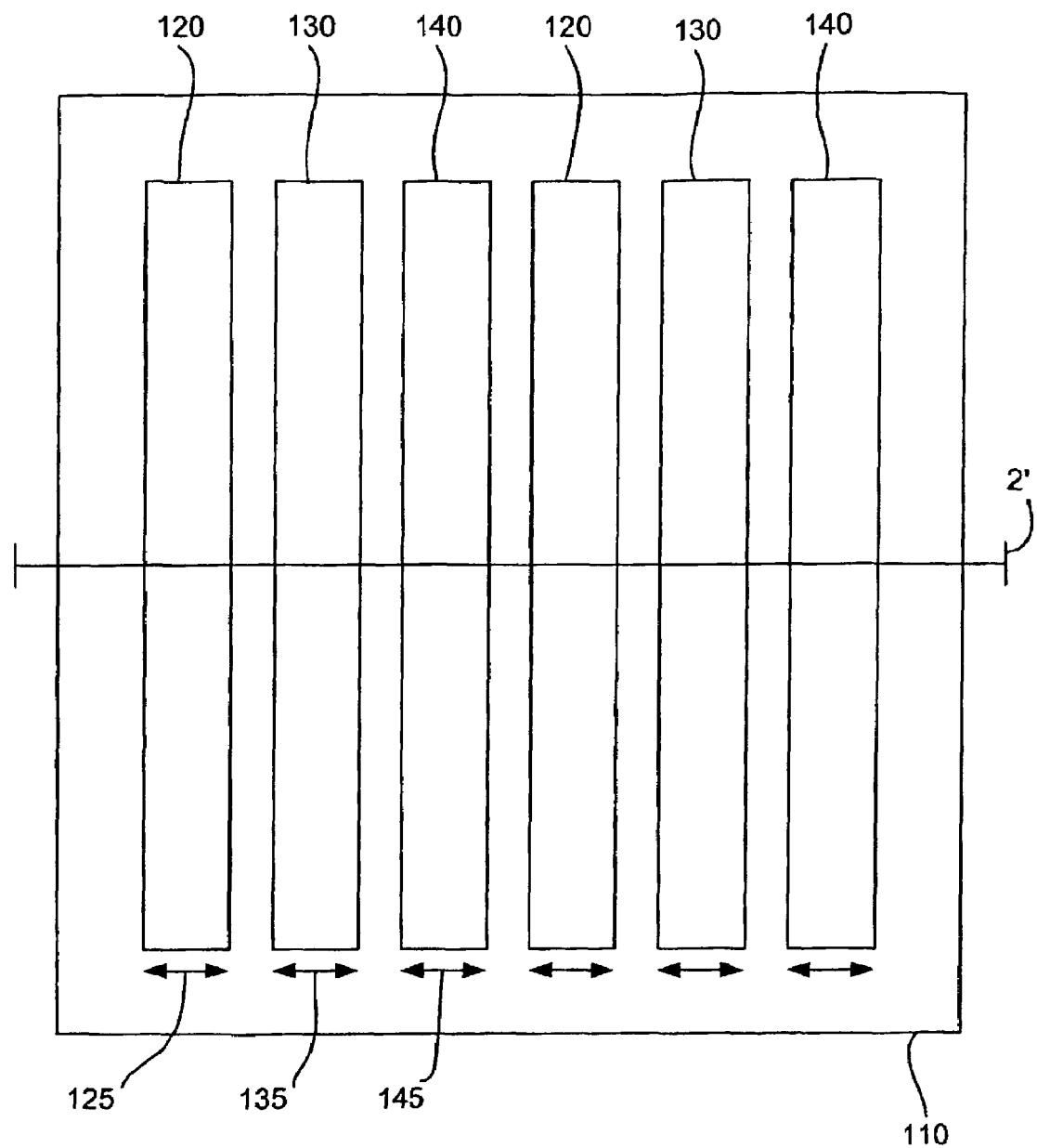
FIG. 1 shows a device having a striped configuration.

Several features of organic light emitting devices (OLEDs) may make them particularly suitable for use in illumination, as a replacement for conventional incandescent, fluorescent, and other light sources. Some specific applications include backlights, interior signage, internal lighting, and external lighting. In addition, it is believed that OLEDs may be superior to another emerging technology, inorganic LEDs, for such applications.

Phosphorescent OLEDs may have a high internal and external quantum efficiency. Properly utilized, this efficiency may translate into high wall plug efficiency, higher than conventional incandescent bulbs and perhaps ultimately competitive with conventional fluorescent bulbs. A wide range of intensities is available with OLEDs, ranging from 10 to over 10,000 cd/m$^2$, such that a wide dynamic range of lighting may be possible without flicker. Moreover, OLEDs may have drive voltages as low as a few volts, which means that simple, efficient drivers may be used to power OLED devices.

OLEDs may have a form factor and color considerations that are superior to conventional light sources such as incandescent and fluorescent bulbs. OLEDs may be fabricated as a very thin, light weight, flexible sheet, which makes them installable in new ways and places, and more readily transported and stored. OLEDs provide diffuse, Lambertian emission that may be uniform over a large area, providing lighting that is more pleasing than harsh fluorescent bulbs. OLEDs may provide a broad area of emission, in contrast to inorganic LEDs, which are point sources. By providing light over a large area, OLEDs may reduce shadowing when compared to conventional bulbs. For example, a whole wall or ceiling could emit light. A transparent OLED may be used, for example, to create a window that can also emit light. Such a window could, for example, be used as an actual window during the day, and as a light source after dark. OLEDs generally have a broad emission spectra, which is favorable when trying to achieve white light. Light sources using OLEDs may have color components that are individually tunable, such that excellent CIE and CRI whites are obtainable. In addition, a light source made up of a combination of OLED emission spectra may be tunable by a user to create customizable mood lighting. For example, controls such as dials may be provided such that the user can increase or decrease the amount of each component in the light, for example to create light having a blue or red hue. Controls may also be provided so that a user can adjust the intensity of light. The on-off, hue control, and/or intensity settings may also be voice-controlled.

OLEDs are made of inexpensive materials, such that they may potentially have manufacturing costs similar to conventional incandescent and fluorescent bulbs. Because OLEDs may have a thin-film solid state structure, they may be more rugged, vibration resistant, and safer than conventional bulbs.

Factors generally considered when evaluating illumination technology include ease of fabrication, useful lifetime, power efficiency, and the quality of the light source. Many of these factors have important cost implications. Ease of fabrication and useful lifetime affect the cost of buying and replacing or maintaining a light source. Power efficiency affects the cost of operating a light source. The quality of the light source affects suitability for use in particular applications. Some aspects of quality may be quantified using methods well known to the art. For example, CIE ("Commission Internationale d'Eclairage") is a recognized two-coordinate measure of the color of light. Ideal white light has a CIE of (0.33, 0.33). For white light sources, CRI ("Color Rendering Index") is a recognized measure of the color shift that an object undergoes when illuminated by the light source as compared with the color of the same object when illuminated by a reference source comparable to daylight. CRI values range from 0 to 100, with 100 representing no color shift. Bright sunlight may have a CRI of 100. Fluorescent light bulbs have a CRI of 60-99, mercury lamps near 50, and high-pressure sodium lamps can have a CRI of about 20. Lamps used for home or office lighting, for example, generally must meet very strict CIE and CRI requirements, whereas lamps used for street lighting, for example, may be subject to more lenient CIE and CRI requirements.

Based on the standards established by conventional light sources, goals for an OLED used for conventional lighting include a CIE of preferably about (0.33, 0.33), a CRI preferably greater than 75, more preferably greater than about 80, more preferably greater than about 85, and most preferably greater than about 90, a luminescent efficiency preferably greater than about 50 lm/W, a brightness of about 800 cd/m2, and/or 20,000 hours operating lifetime.

Phosphorescent OLED technology, as disclosed in U.S. Pat. No. 6,303,238 to Thompson et al., which is incorporated by reference in its entirety, enables the fabrication of highly efficient OLEDs. In a phosphorescent OLED, nearly 100% of the excitons may be converted to light, whereas in a fluorescent OLED, only about 25% of the excitons may be converted to light. Internal quantum efficiencies approaching 100% are possible with such technology, and have been demonstrated for green OLEDs, as reported in Adachi et al., "High Efficiency Organic Electrophosphorescent Devices with tris[2-phenylpyridine]Ir Doped Into Electron Transporting Materials," J. App. Phys. vol. 90 no. 10, 5048-51, November 2001 ("Adachi"), which is incorporated by reference in its entirety. Due to this high internal quantum efficiency, phosphorescent OLEDs may be suitable for use in lighting applications where power efficiency is a factor. The efficiencies attainable with fluorescent OLEDs are generally not competitive with the efficiencies of conventional lighting technology, rendering them unsuitable for many applications. However, there may be situations where fluorescent OLEDs are usable for lighting.

At least three major factors determine the net efficiency of an OLED: the internal quantum efficiency, the external quantum efficiency, and the drive voltage. Internal quantum efficiency is a measure of the fraction of charge carriers in the emissive layer of an OLED that combine to form excitons and then emit light, as opposed to decaying by mechanisms that do not emit light. Using phosphorescent materials enables internal quantum efficiencies approaching 100%. External quantum efficiency is a measure of the fraction of light emitted by the emissive layer that is emitted by the device to a viewer. External quantum efficiency may be decreased because photons are lost by waveguiding, light absorption, and other factors. Improved outcoupling may be used to improve external quantum efficiency. One goal for external quantum efficiency is about 40%, about a factor of two from the nearly 18% external quantum efficiency demonstrated by Adachi. Various techniques may be used to achieve improved external quantum efficiency, including textured interfaces and surfaces, diffractive optical elements, corrugated or rough interfaces/surfaces, shaped devices, and simple optical elements including lenses, low refractive index substrate, and high refractive index substrates in combination with lenses. These techniques may be used to much greater advantage in devices used for lighting than in devices used in displays. For example, lenses may distort images when used in displays, but image distortion is not an issue for lighting applications. Drive voltage is important, because any voltage drop in the OLED greater than the energy of the emitted photons essentially represents wasted power. Drive voltage may be reduced through the use of certain techniques, such as doping transport layers and layers that enhance the injection of charge carriers.

In one embodiment of the invention, a striped configuration is used to achieve excellent quality, as measured by the CRI and CIE of the resultant light source. The striped configuration also enables the optimization of each of the individual color components used to generate a desired CRI and CIE result, such as white light suitable for use in lighting applications. For example, different techniques may be used to individually optimize the internal quantum efficiency, the external quantum efficiency, and the drive voltage of each color.

FIG. 1 shows a device 100 having a striped configuration that may be used to create a highly efficient light source adapted to emit white light. Fabricated on a substrate 110, first region 120 includes an OLED having an emissive layer adapted to emit a first spectrum of light. The OLED of first region 120 may be any suitable OLED known to the art, fabricated using any technique known to the art. For example, single layer, single heterostructure, and double heterostructure OLEDs may be used. Features such as blocking layers and layers that enhance the injection of charge carriers may be used. The use of a phosphorescent OLED is preferred for applications where efficiency is a factor. Organic vapor phase deposition (OVPD), such as disclosed in U.S. Pat. No. 6,337,102, which is incorporated by reference in its entirety, is one method for fabricating the OLED of region 120, due to its projected low cost. Second region 130 and third region 140 may be adapted to emit second and third spectra of light, respectively, and may have features similar to those of first region 120. The length of regions 120, 130 and 140 (the dimension perpendicular to widths 125, 135 and 145) may be large, limited only by the fabrication technique and the desired size of device 100. For example, lengths of up to 6 inches may be used if device 100 is fabricated using equipment designed to process 6 inch substrates. Lengths of up to two feet may be used for two foot ceiling panels using suitable equipment. Larger lengths may also be used.

Width 125 of first region 120, width 135 of second region 130, and width 145 of third region 140 may be selected based on a number of considerations. One consideration is cost. Generally, wider regions are easier and cheaper to fabricate. For widths above about 0.5 mm, relatively inexpensive shadow masking technology, without complex alignment, may be used for device fabrication. Wide stripes may also enable the use of other techniques, such as stamping as disclosed in U.S. Pat. No. 6,294,398, which is incorporated by reference in its entirety, or organic vapor jet deposition (OVJD) through patterning nozzles, as disclosed in U.S. Provisional Patent Application Ser. No. 60/317,215, filed Sep. 4, 2001, which is incorporated by reference in its entirety. Preferably, the distance separating regions 120, 130 and 140 from each other is as small as possible, taking into account the limitations and expense of the patterning techniques used, recognizing that there may be a trade-off between cost and achieving a high fill-factor. In one embodiment, each region is fabricated from the same materials and using the same processes, except for the organic emissive layers, which may be different materials or have different dopants.

Width is related to pitch, which is the center-to-center spacing of features such as stripes. Pitch is a factor in determining how light appears to a viewer. In combination with other factors such as how far away a viewer is, and whether a diffuser is used, pitch determines how light appears to a viewer. Where different regions emit different colors, the angle subtended by the eye for each region is a factor that affects whether the individual color components may be discerned. For some applications, such as interior lighting designed for placement on a wall, it may be desirable that a viewer can not resolve individual color components, so a small pitch may be needed. The pitch needed for a light source to appear uniform varies by application. For example, a very large pitch may be used for stadium lighting, whereas a smaller pitch would be needed for interior lighting. For other applications, the way a light source appears to a viewer looking at the light source may not be important. For example, in an industrial setting, it may not matter whether a viewer looking at a light source can resolve individual color components, so long as the light is sufficiently diffuse by the time it reaches the objects being illuminated. In such a situation, it may be desirable to use larger widths and pitches to economize on fabrication costs. Light suitable for illumination purposes depends upon the application, but generally means that the light that originates from different regions emitting different spectra is not apparent to a viewer observing the illuminated objects or area. For some applications, there may be a stricter requirement that a viewer looking at the light source itself can not distinguish the individual color components.

Whether or not a striped geometry is used, embodiments of the present invention may be fabricated with large aspect ratios, for example 4 to 1 or greater. The aspect ratio is the ratio of the largest dimension of a single light emitting region to the smallest dimension in the plane of the device. For example, a stripe four times longer than it is wide would have an aspect ratio of 4 to 1. A square would have an aspect ratio of 1 to 1. The use of large aspect ratios may be favorable for several reasons, including the fact that a device having regions with large aspect ratios may have less interconnects and be cheaper to manufacture than a device with smaller aspect ratios, such as a display. Shapes other than rectangles and squares may be used. Large aspect ratios may also enable the use of certain fabrication techniques, such as deposition of long stripes by OVJD, where the stripes are effectively "painted" on the substrate by moving a jet nozzle relative to the substrate while the nozzle is ejecting organic material. Displays generally have aspect ratios of about 1 to 1 for monochrome displays to about 3 to 1 for full color displays, where each three color pixel may have an aspect ratio of about 1 to 1, but may include three separate devices, each having an aspect ratio of about 3 to 1. Aspect ratios larger than about 3 to 1 are generally not suitable for displays, because large aspect ratios would interfere with display resolution in one direction.

Figure 2:
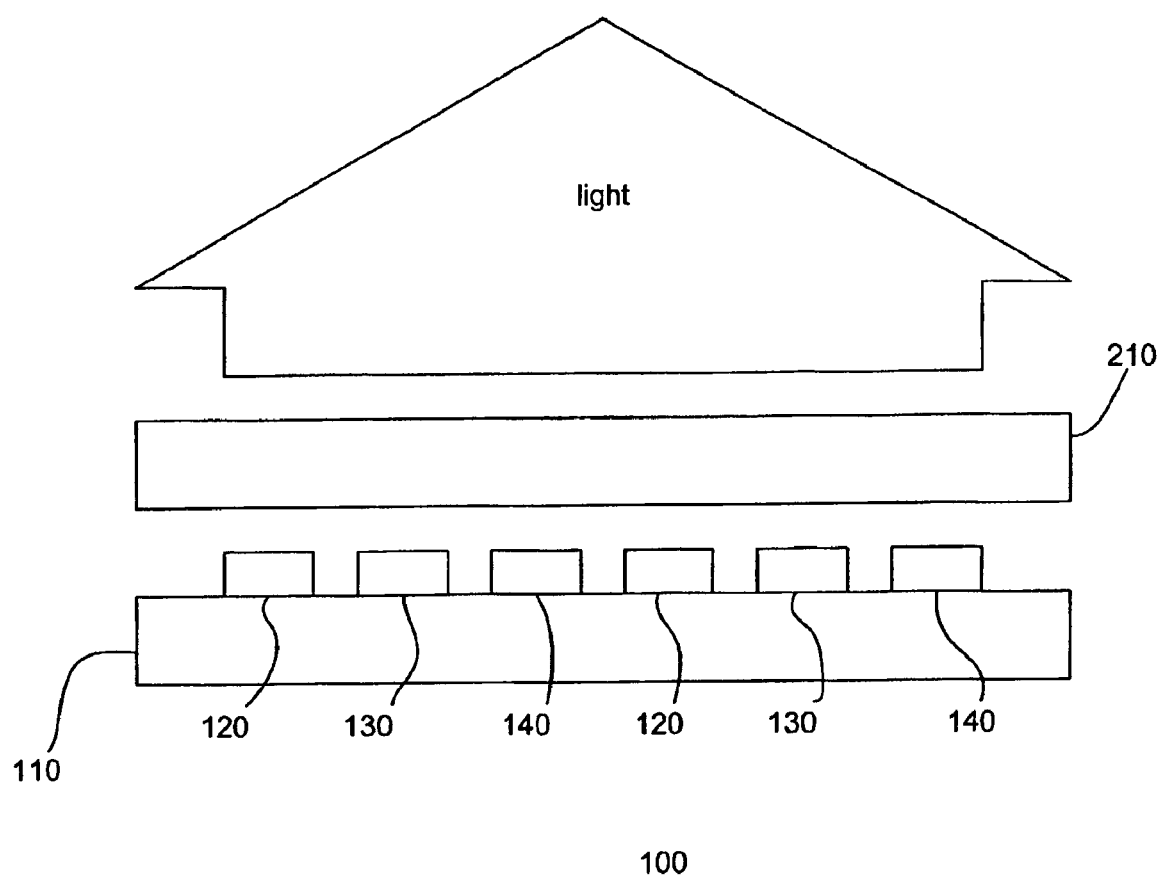
FIG. 2 shows a cross-section of the device of FIG. 1, with a diffuser.

Even with large pitches, light that appears to have a uniform color to a viewer may be achieved with the use of a diffuser. FIG. 2 shows a cross section of device 100 across line 2' of FIG. 1, with a diffuser 210 disposed over regions 120, 130 and 140, such that light passes through the diffuser before reaching a viewer. Light passing through diffuser 210 is diffused such that the individual spectra of light emitted by regions 120, 130, and 140 become mixed and indistinguishable to a viewer. Embodiments employing a diffuser other than the one specifically illustrated in FIG. 2 may be used. For example, diffuser 210 may be in contact with regions 120, 130 and 140. Light may be emitted through substrate 110, and then through a diffuser disposed under substrate 110, to a viewer. Substrate 110 may itself be a diffuser.

Using a diffuser generally involves decreased external quantum efficiency, extra cost, and may involve extra fabrication steps if the diffuser is integrated. The benefit of a diffuser is that light that appears uniform may be achieved with larger pitches. Whether the light appears uniform may depend upon a number of factors related to the particular application, including the pitch and the angle subtended by the eye. Larger pitches may have benefits, such as lower fabrication costs and higher yield.

Widths 125, 135 and 145 are not necessarily all the same. Because regions 120, 130, and 140 are each adapted to emit a different spectrum of light, and may be made with different materials, it may be desirable to have each region emit light at a different intensity or use different drive currents. For example, one region may use materials that have a short operational lifetime unless a particularly low drive current (and correspondingly lower intensity) is used. Or, it may be difficult to obtain a high intensity from a particular color, but relatively easy to obtain high intensity from the other colors. But, in order to achieve a desired overall spectrum, a particular luminous flux (the total amount of light emitted by a region) may be needed from each region. The luminous flux of each region may be adjusted, without changing the drive current or the intensity of light (the amount of light per unit area), by selecting the width of the region. In general, it may be desirable to select the widths of the regions such that greatest width corresponds to the "weakest" color in terms of intensity or lifetime, to compensate for a relatively low intensity. There may also be relatively greater efficiency gains for lowering the drive current of one region, compared to the other regions. Thus, the efficiency and/or lifetime of the device as a whole may be enhanced by using regions of different widths.

Preferred modes of driving the OLEDs of regions 120, 130 and 140 include DC mode from a constant current source, and AC mode. These drive modes may enhance lifetime and efficiency.

Because embodiments of the present invention are used for illumination, every part of a given region may be driven at the same current density. Unlike a display screen, there is no need to emit one color, such as red, for example, more intensely in one part of the device as opposed to another, because there is no need to form an image. As a result, simple control circuits that do not require addressing may be used.

The efficiency of organic light sources may decrease with time, and different colors may degrade at different rates. Such degradation may cause the color of a white light having separate color components generated by OLEDs to shift over time ("differential color aging"). Each region may be separately monitored for degradation using a photodetector, and the drive current of each region adjusted accordingly to compensate for degradation. The photodetectors may be integrated into the various regions, as disclosed in pending patent application Ser. No. 10/219,760, filed Aug. 16, 2002, which is incorporated by reference in its entirety. Other methods to monitor the intensity of each color component may also be used, such as commercially available external photodetectors disposed near or on the regions of device 100, "external" in the sense that they are not fabricated as integral parts of the regions. The desired color may thus be maintained over time. This monitoring may be performed once for each color in device 100, or may be for each individual stripe in device 100, even if multiple stripes emit the same color. Such monitoring may result in a device 100 having a significantly improved lifetime.

Device 100 may be adapted to emit white light by using regions 120, 130, and 140 that are adapted to emit red, green, and blue, respectively. Other combinations are possible, such as regions adapted to emit or red, yellow and blue, respectively. In addition, more or less than three different regions may be used. For example, a device 100 that emits white light may be achieved by using only two different regions that emit blue and yellow light, respectively. As used herein, the terms "red," "yellow," "green" "blue," and other colors are used in a very broad sense to refer to broad ranges of wavelength that are not strictly limited. For example, "red" and "yellow" may overlap, and may both include various hues of orange.

Widths 125, 135 and 145, and the drive current of each color, may also be selected to achieve a desired color of light. While one preferred embodiment for illumination emits light having a CIE of about (0.33, 0.33) and a CRI preferably greater than about 75, more preferably greater than about 80, more preferably greater than about 85, and most preferably greater than about 90, other embodiments are possible, such as mood lighting having a slight tinge of color, or ornamental lighting. By separately addressing each of the different regions 120, 130 and 140 of device 100, the full range of colors that may be obtained from mixing the colors emitted by these regions may be obtained.

As illustrated in FIG. 1, regions 120, 130 and 140 may be repeated multiple times to achieve a desired width for device 100.

It has been suggested that inorganic light emitting diodes (LEDs) may be suitable for illumination purposes. See, U.S. Pat. No. 5,851,063 to Doughty. OLEDs are superior to inorganic LEDs in many respects, and different considerations must be taken into account when using the different types of devices. Inorganic LEDs are generally discrete devices that must be individually wired, and have significant limitations on the fill factor attainable due to the sizes of the individual devices. These limitations may also render it difficult or impossible to avoid the use of a diffuser with inorganic LED technology for certain applications, such as overhead lighting, because it will be difficult to achieve small, closely spaced regions emitting different colors. Because LEDs are hard wired, it may be difficult to use certain favorable addressing schemes, such as matrix addressing. Inorganic LEDs are also point light sources, and a diffuser, angling, and/or some other additional measures may be necessary to achieve the Lambertian emission that is generally preferred for many illumination applications.

OLEDs, by contrast, are thin-film devices that provide excellent form factor, especially when built on flexible plastic substrates or metal foils. OLEDs are bright and colorful Lambertian emitters with high power efficiency at low voltages. OLEDs may be patterned by a variety of methods that result in better resolution and higher fill factors than LEDs at a lower cost. For example, OLEDs may be spaced very closely together, and fill factors preferably exceeding 50%, and more preferably exceeding 70%, may be achieved. These fill factors represent the percentage of area that is actually emitting light, and may avoid the need to use optical elements, such as lenses, to enhance the percentage of surface area that appears to a viewer as illuminated. These fill factors may be achieved in bottom emitting devices. It is believed that a 50% fill factor for a bottom emitting display device is not practical, and a 70% fill factor for a bottom emitting display device may not be achievable, due to the need for interconnects and for spaces between the pixels in both the horizontal and vertical directions. However, depending upon the application, lower fill factors may be used for illumination purposes. OLEDs that emit different colors may be easily placed in close proximity with a high fill factor (and lower pitches), such that white light may be achieved without the use of a diffuser. OLEDs may be controlled through integrated bus lines, such as disclosed in U.S. Pat. No. 6,407,408, which is incorporated by reference in its entirety, which are superior to the individual wiring of inorganic LEDs in many respects. OLEDs emit light from a wide area, as contrasted to the point source emission of an inorganic LED, such that optical elements generally used to disperse the light emitted by an inorganic LED may not be necessary with OLEDs. In addition, it is believed that OLEDs generally have broader emission spectra than inorganic LEDs, which favorably enables higher CRI values with OLEDs. For example, a CRI of about 98 was calculated for a three region organic device in connection with FIG. 3 of the present patent, whereas an example disclosed in U.S. Pat. No. 5,851,063 to Doughty et al., which is incorporated by reference in its entirety, discloses a CRI of about 86.3 for a three inorganic LED device, and about 96.0 for a four inorganic LED device.

With a simple device structure (as described above) in conjunction with flexible OLED and OVPD technologies, significantly higher-throughput, roll-to-roll (R/R) processing will mean that OLEDs can also become cost-effective from a manufacturing perspective in lighting applications.

OLED structures capable of emitting white light have been disclosed in the literature. However, these structures generally do not allow for the type of optimization that may be achieved with embodiments of the present invention. As a result, the previously disclosed OLED structures may not be as efficient, and/or may not have the superior CIE and CRI values attainable with embodiments of the present invention.
Experimental A patterned filter was placed over a white illumination source to simulate the striped configuration of FIG. 1. The filter divided the light into alternating stripes of red, green, and blue. A filter having 0.5 mm wide stripes resulted in light that appeared uniformly grey, and individual color components could not be resolved by a viewer in the same room. With a filter having 5 mm wide stripes, viewers in the same room could readily distinguish the individual red, green, and blue stripes. When a diffuser was placed over the filter having 5 mm wide stripes, the light once again appeared uniformly grey.

Known spectra for various OLEDs were obtained. In particular, spectra were obtained for the following OLED emissive materials:

| NPD | fluorescent blue | 4,4'-bis[N-(1-napthyl)-N-phenyl-amino]biphenyl |
|---|---|---|
| BAlq | fluorescent blue | aluminum(III)bis(2-methyl-8-quinolinato)4-phenylphenolate |
| ppy7 | phosphorescent blue | Bis{2[2,4-difluor-5-trifluoromethylphenyl]-pyridinato}Ir(III)acetylacelonate |
| Alq | fluorescent green | tris-(8-hydroxyquinoline)aluminum |
| BOIr | phosphorescent green | Bis(2-phenylbenzoxazole)Iridium Acetylacetonate |
| PQ14 | phosphorescent red | Bis[(phenyl)-3methylquinolinato](acetoacetato)-Iridium(III) |
| PQ5 | phosphorescent red | Bis[2-(m-mthoxyphenyl)quinolato]-(acetylacetonato)Iridium(III) |

Figure 3:
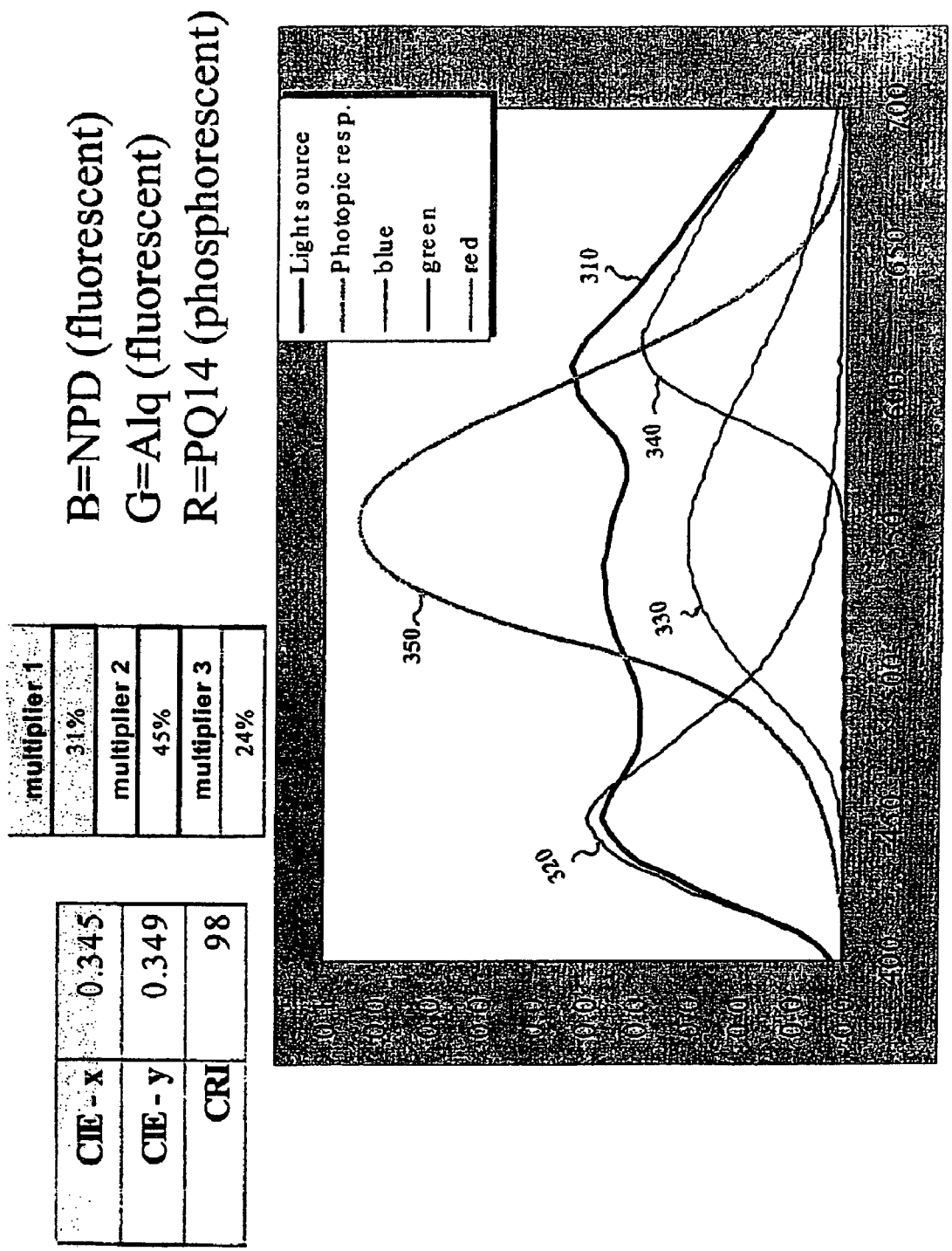
FIG. 3 shows a composite spectrum calculated based on a combination of a fluorescent blue spectrum, a fluorescent green spectrum, and phosphorescent red spectrum.

FIG. 3 shows a composite spectrum 310 calculated based on a combination of a fluorescent blue (NPD) spectrum 320, a fluorescent green (Alq) spectrum 330, and phosphorescent red (PQ14) spectrum 340. The blue, green, and red spectra were responsible for 31%,45%, and 24%, respectively, of composite spectrum 310. Plot 350 shows the photopic region, a measure of the wavelengths of light that can be detected by the human eye. Composite spectrum 310 has a CRI of 98, and a CIE of (0.345, 0.349).

Figure 4:
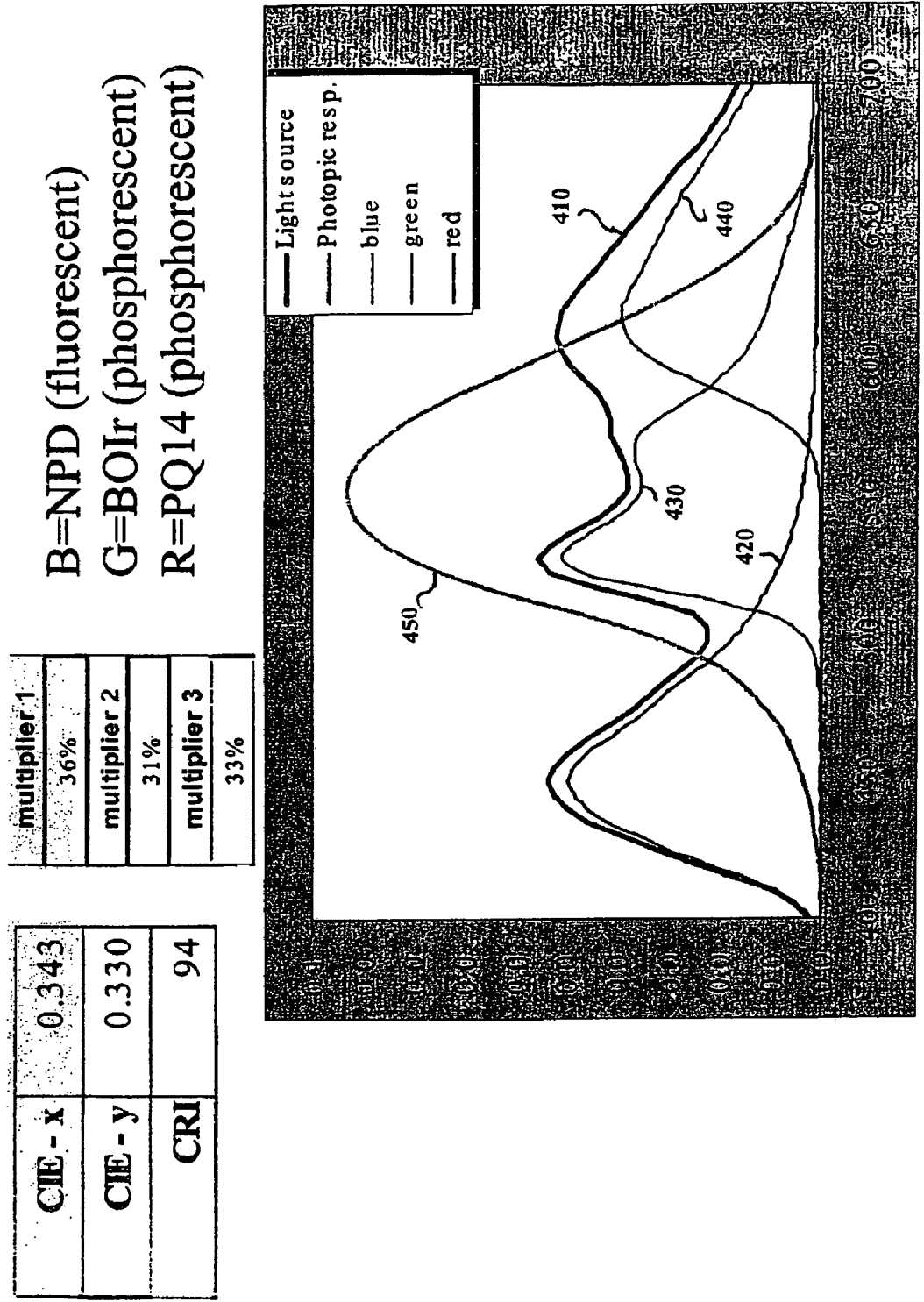
FIG. 4 shows a composite spectrum calculated based on a combination of a phosphorescent blue spectrum, a phosphorescent green spectrum, and phosphorescent red spectrum.

FIG. 4 shows a composite spectrum 410 calculated based on a combination of a fluorescent blue (NPD) spectrum 420, a phosphorescent green (BOIr) spectrum 430, and phosphorescent red (PQ14) spectrum 440. The blue, green, and red spectra were responsible for 36%,31%, and 33%, respectively, of composite spectrum 410. Plot 450 shows the photopic region, a measure of the wavelengths of light that can be detected by the human eye. Composite spectrum 410 has a CRI of 94, and a CIE of (0.343, 0.330).

Figure 5:
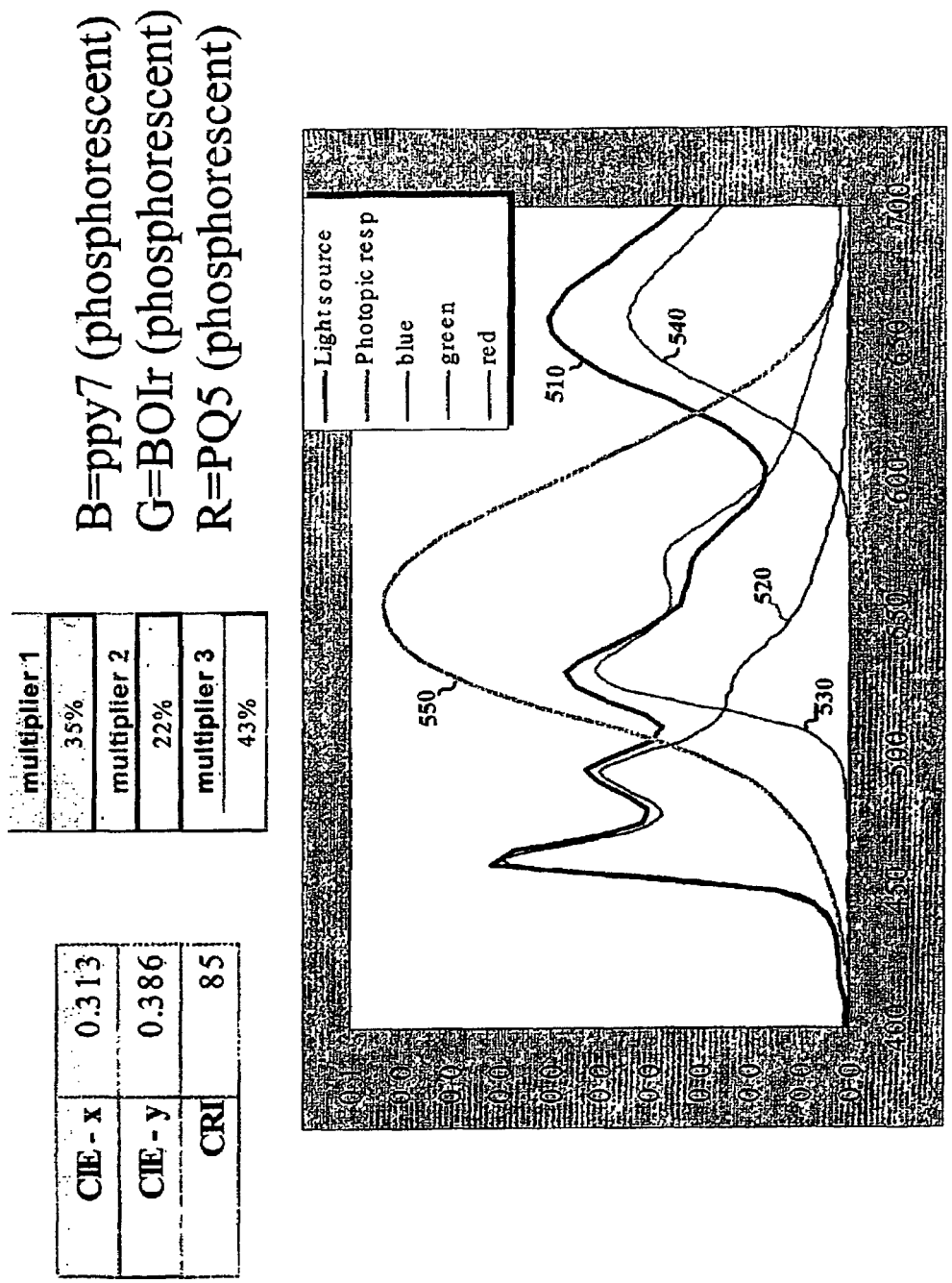
FIG. 5 shows a composite spectrum calculated based on a combination of a fluorescent blue spectrum, a phosphorescent green spectrum, and phosphorescent red spectrum.

FIG. 5 shows a composite spectrum 510 calculated based on a combination of a phosphorescent blue (ppy7) spectrum 520, a phosphorescent green (BOIr) spectrum 530, and phosphorescent red (PQ5) spectrum 540. The blue, green, and red spectra were responsible for 35%, 22%, and 43%, respectively, of composite spectrum 510. Plot 550 shows the photopic region, a measure of the wavelengths of light that can be detected by the human eye. Composite spectrum 510 has a CRI of 85, and a CIE of (0.313, 0.386).

Figure 6:
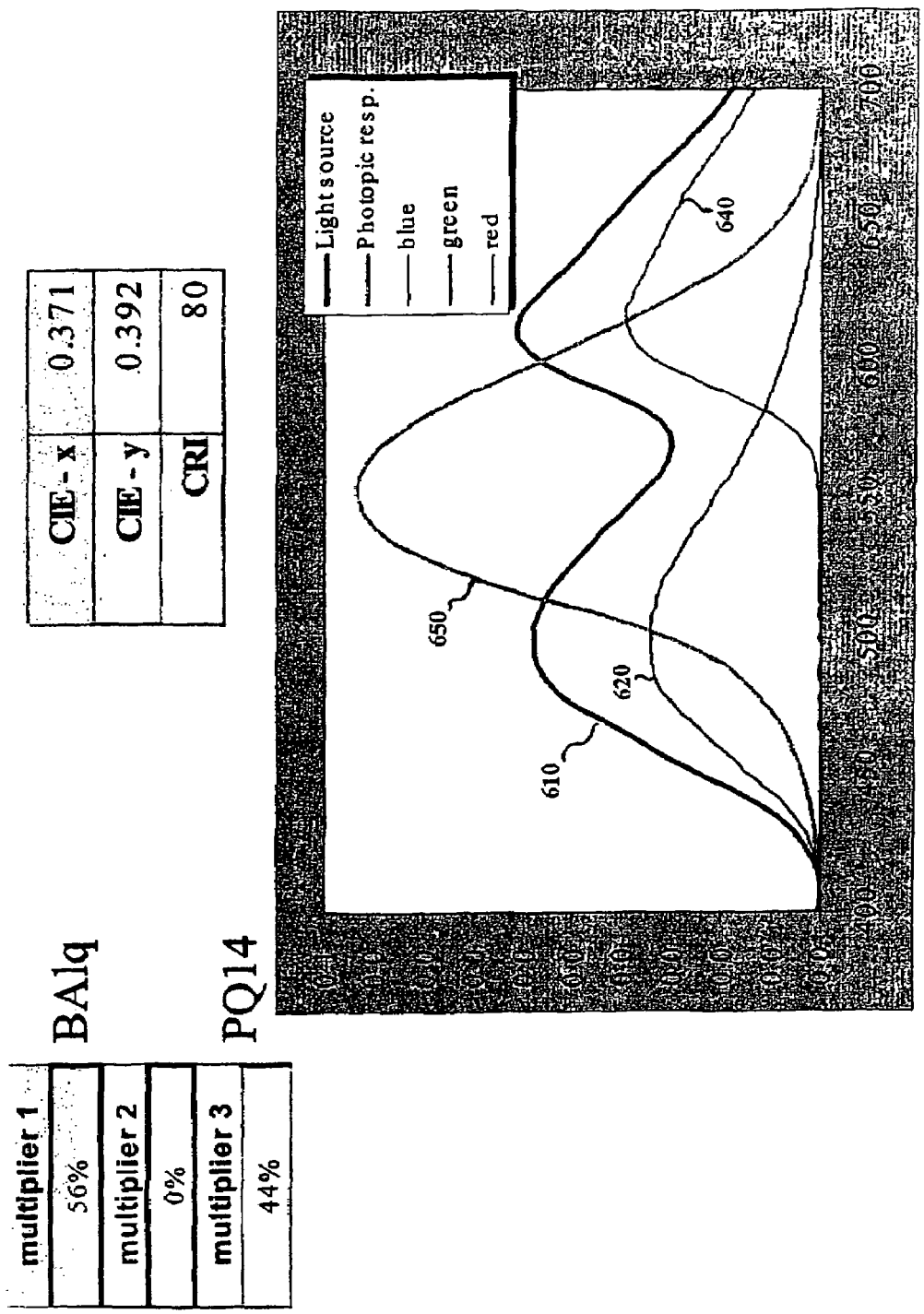
FIG. 6 shows a composite spectrum calculated based on a combination of a phosphorescent blue spectrum, and fluorescent red spectrum.

FIG. 6 shows a composite spectrum 610 calculated based on a combination of a fluorescent blue spectrum 620, and phosphorescent red spectrum 640. The blue and red spectra were responsible for 56% and 44%, respectively, of composite spectrum 610. Plot 650 shows the photopic region, a measure of the wavelengths of light that can be detected by the human eye. Composite spectrum 610 has a CRI of 80, and a CIE of (0.371, 0.392).

The examples of FIGS. 3 through 6 show that remarkable CIE and CRI values for white light may be obtained by combining the emission spectra from various OLED devices using organic emissive materials available today. Significant development of new organic emissive materials, particularly phosphorescent materials, is presently occurring. As new materials become available, it is expected that better CRI and CIE values may be obtained. In any event, the CIE and CRI values obtained from calculations based on presently available materials are remarkable, such as a CRI of 85, and CIE (0.313, 0.386) for all phosphorescent devices. The calculations show that it is possible to combine the spectra from three different OLEDs to obtain white light having a CRI of 98 and a CIE of (0.33.+−0.0.02, 0.33.+−0.0.02). Of course, lower CRI values may be readily achieved, such as CRI greater than preferably 85, more preferably 90, and more preferably 95. While a higher CRI is generally more desirable, CRI of 85 and above are generally considered excellent for illumination, so it may be desirable to use a CRI lower than the extremely high 98 demonstrated above in order to obtain other benefits, such as more efficiency, decreased manufacturing costs, or a wider selection of emissive materials.

Similarly, the calculations show that it is possible to combine the spectra from two different OLEDs to obtain white light having a CRI of at least 80 and a CIE of (0.33.+−0.0.04, 0.33.+−0.0.07). The two spectra device may be useful for lighting applications because the CRI and CIE values are acceptable, and it is expected that a two-color device will have lower manufacturing costs than a three-color device.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art. While some of the specific embodiments may be described and claimed separately, it is understood that the various features of embodiments described and claimed herein may be used in combination.

What is claimed:

1. A method of fabricating an illumination source, capable of producing light, having a CRI value of at least about 80, the method comprising:
    fabricating a first stripe, having a first area, the first stripe comprising a first organic emissive layer, adapted to emit a first spectrum of light;
    fabricating a second stripe, having a second area, the second stripe comprising a second organic emissive layer, adapted to emit a second spectrum of light; wherein
    each stripe has an aspect ratio greater than about 4 and a width greater than about 0.5 mm;
    the first organic emissive layer in the first stripe emits the first spectrum of light, the second organic emissive layer in the second stripe emits the second spectrum of light, and the first spectrum of light is different from the second spectrum of light when voltages are applied across the first and second stripes; and
    fabricating a drive circuitry for supplying a predetermined drive current to each stripe, which achieves a combination of light emitted from the emissive layers having a CRI value of at least about 80.

2. The method of claim 1, further comprising fabricating the first and second stripes so that the first area is different from the second area.

3. The method of claim 1, further comprising fabricating the stripes in a process comprising stamping emissive materials over a substrate.

4. The method of claim 1, further comprising fabricating the stripes in a process comprising depositing emissive materials by OVJD over a substrate.

5. The method of claim 1, further comprising fabricating each stripe with a width greater than about 5 mm.

6. The method of claim 1, wherein a combination of the first spectrum of light and the second spectrum of has a CIE of (0.33±0.04, 0.33±0.07).

7. The method of claim 1, further comprising providing color correction circuitry, adapted to individually control the current passing through each stripe to correct for any differential aging of the stripes.

8. The method of claim 1, further comprising fabricating a third stripe having a third organic emissive layer adapted to emit a third spectrum of light from a third organic emissive material; wherein the third spectrum of light differs from the first and second spectra of light; and a combination of the light emitted from the emissive layers has a CRI value greater than 80 when a voltage is applied across each of the stripes.

9. The method of claim 8, further comprising fabricating the third stripe to have an area different from the first and second areas of the first and second stripes.

10. The method of claim 8, further comprising fabricating the stripes in a process comprising stamping the emissive materials over a substrate.

11. The method of claim 8, further comprising fabricating the stripes in a process comprising depositing the emissive materials by OVJD over a substrate.

12. The method of claim 8, further comprising fabricating each stripe with a width greater than about 5 mm.

13. The method of claim 8, wherein the CRI value is greater than 85.

14. The method of claim 8, wherein the CRI value is greater than 90.

15. The method of claim 8, wherein the CRI value is greater than 95.

16. The method of claim 8, wherein the light has a CIE of (0.33±0.04, 0.33±0.07).

17. The method of claim 8, wherein the light has a CIE of (0.33±0.02, 0.33±0.02).

18. The method of claim 8, further comprising providing color correction circuitry adapted to individually control the current passing through each stripe to correct for any differential aging of the stripes.

19. A method of fabricating an illumination source, capable of producing light, having a CRI value of at least about 80, the method comprising:
    fabricating a plurality of stripes, each stripe having an area, and comprising an organic emissive layer, adapted to emit a spectrum of light, wherein each stripe has an aspect ratio greater than about 4 and a width greater than about 0.5 mm;
    when voltages are applied across the plurality of stripes, the stripes emit at least three different spectra of light; and
    fabricating a drive circuitry for supplying a predetermined drive current to each stripe, which achieves a combination of the emitted spectra of light having a CRI value of at least about 80.

20. An organic light emitting device comprising a plurality of light-emitting regions, each of said regions comprising one organic emissive layer selected from a plurality of different organic emissive layers, wherein:
    (a) each of the plurality of emissive layers is adapted to emit a different spectrum of light;
    (b) the light-emitting regions are in the form of stripes having an aspect ratio greater than 4 and a width greater than 0.5 mm; wherein the light emitting fill factor of the device exceeds 70%;
    (c) the drive current for each different type of emissive layer is individually adjusted; or the different types of emissive layers have different areas; or both; and
    (d) the device emits light having a CRI greater than 80 when power is provided to the plurality of light-emitting regions.

21. The device according to claim 20, comprising at least three different kinds of light-emitting regions, which respectively comprise:
    (a) a first organic light emissive layer adapted to emit a first spectrum of light from a first emissive material;
    (b) a second organic light emissive layer adapted to emit a second spectrum of light from a second emissive material; and
    (c) a third organic light emissive layer adapted to emit a third spectrum of light from a third emissive material.

22. The device according to claim 20, comprising only three different kinds of light-emitting regions, which respectively comprise:
    (a) a first organic light emissive layer adapted to emit a first spectrum of light from a first emissive material;
    (b) a second organic light emissive layer adapted to emit a second spectrum of light from a second emissive material; and
    (c) a third organic light emissive layer adapted to emit a third spectrum of light from a third emissive material.

23. The device according to claim 22, wherein the first, second and third emissive layers do not all have equal areas.

24. The device according to claim 20, comprising only two different kinds of light-emitting regions, which respectively comprise:
   (a) a first organic light emissive layer adapted to emit a first spectrum of light from a first emissive material; and
   (b) a second organic light emissive layer adapted to emit a second spectrum of light from a second emissive material.

25. The device according to claim 24, wherein the first and second emissive layers do not have equal areas.

26. The device according to claim 20, wherein the emitted light has a CIE of (0.33+/−0.04, 0.33+/−0.07).

27. The device according to claim 20, wherein the width of the light-emitting regions is greater than 5 mm.

* * * * *